United States Patent
Eriksson

(10) Patent No.: US 6,327,886 B1
(45) Date of Patent: Dec. 11, 2001

(54) METHOD, A DEVICE, AND A WORK PIECE FOR PRODUCING A HEAT TRANSFER MEMBER

(75) Inventor: Gunno Eriksson, Hallstahammar (SE)

(73) Assignee: AB Webra Industrl, Enloping (SE)

( * ) Notice: Subject to any disclaimer, the term of this patent is extended or adjusted under 35 U.S.C. 154(b) by 0 days.

(21) Appl. No.: 09/599,244

(22) Filed: Jun. 22, 2000

Related U.S. Application Data

(63) Continuation-in-part of application No. 09/379,472, filed on Aug. 23, 1999, now Pat. No. 6,138,489.

(30) Foreign Application Priority Data

Jun. 7, 2000 (SE) .................................................... 0002124

(51) Int. Cl.⁷ .................................................. B21C 23/00
(52) U.S. Cl. ........................ 72/256; 72/253.1; 165/80.3
(58) Field of Search ................................. 72/253.1, 256, 72/260; 29/890.03; 165/80.3, 185; 361/709; 257/718

(56) References Cited

U.S. PATENT DOCUMENTS 4,187,711 * 2/1980 Lavockin et al. ...................... 72/256
6,138,489 * 10/2000 Eriksson ................................ 72/256

FOREIGN PATENT DOCUMENTS

1523208 * 11/1989 (SU) ..................................... 72/260

OTHER PUBLICATIONS

"The KA–FAB Difference", Kaiser Aluminum, Feb. 1986.*

"A Guide to Aluminum Extrusions", The Aluminum Assoc. May 1979.*

* cited by examiner

Primary Examiner—Ed Tolan
(74) Attorney, Agent, or Firm—Thomas R. Vigil

(57) ABSTRACT

A method for producing a heat transfer member wherein at a first step a work piece (1) is produced comprising a curved base portion (2) with an outer (3) surface, an inner (4) surface, and a number of flanges (5) projecting from the outer surface and in a second step the heat transfer member is formed by straightening out the base portion (2) so that it becomes essentially plane The work piece in the first step is produced so that the distance (a, b) between the outer and the inner surface of the base portion is increasing from its ends towards its central part.

4 Claims, 2 Drawing Sheets

METHOD, A DEVICE, AND A WORK PIECE FOR PRODUCING A HEAT TRANSFER MEMBER

This application is a CIP of Ser. No. 09/379,472 filed Aug. 23, 1999, now U.S. Pat. No. 6,138,489.

FIELD OF THE INVENTION

The present invention is related to a method of producing a heat transfer member, wherein at a first step a work piece is produced comprising a curved base portion with an outer surface and an inner surface, and a number of flanges projecting from the outer surface of the base portion, and in a second step the heat transfer member is formed by straightening the base portion so that it becomes essentially plane.

The invention is also related to a device for producing a work piece for a heat transfer member, whereby the device is adapted to be supplied with a congealable material to an opening comprised in the device, the design of which opening defines the cross-section of the work piece, whereby the opening comprises a curved opening portion with an outer surface and an inner surface, and a number of notches projecting outwardly from the outer surface.

Further, the invention relates to a work piece intended to be formed into a heat transfer member, the work piece comprising a curved base portion with an outer surface and an inner surface, and a number of flanges projecting from the outer surface of the base portion.

Heat transfer devices are used for cooling or heating an object. The field of the invention comprises heat transfer devices within a plurality of application fields, as for example cooling of semi-conductors.

PRIOR ART

The heat transfer member is formed with a base and a number of flanges projecting from the same according to prior art. The base and the flanges may be formed in a plurality of different ways depending on the desired magnitude of the heat transfer, the design of the object intended to be heat transferred, the available space, and so on.

The heat transfer member is arranged with the side of the base opposite the flanges directed towards the object to be cooled.

The heat transfer takes place when the flanges are subjected to a cooling medium in the form of, for example, air or water in that heat is conducted from the object through the device and to the cooling medium.

Heat transfer members are preferably made of a material with a high heat conductivity. Such materials are, for example, gold, copper, and aluminum, as well as different alloys of the same, Aluminum and aluminum alloys are materials well suited for being used for heat transfer devices due to their high conductivity, good deformability, and the fact that they are relatively inexpensive. According to prior manufacturing techniques aluminum is injection-molded or extruded through a tool at an increased temperature and solidified to an intended design. The so-called aluminum profile is formed by the injection-molding or extrusion. The aluminum profile may thereafter be cut into lengths decided for the use in question.

To achieve a good cooling capacity of the device, it is desirable to arrange the device with an area as wide as possible for emitting heat as well as for absorbing cold. Thus, it is desirable to form the flanges with a large height and with small distances adjacent flanges. The height of the flanges and the distance between adjacent flanges are according to previous, known manufacturing methods limited by the tools used for the manufacturing. The tool, through which the material is injection-molded or extruded, is formed with elongated elements corresponding to the gaps between the flanges in the manufactured profile. Said tool is subjected to high loads during manufacturing due to the fact that material of a relatively high temperature is pressed through the same. The elongated elements may be deformed or broken if they have too large a height in relation to the width thereof.

A solution to this problem is known through U.S. Pat. No. 4,187,711. The heat transfer member is produced in two steps. In a first step, a work piece is produced comprising a curved base portion with an outer surface and an inner surface, and a number of flanges projecting from the outer surface, and in a second step the heat transfer member is formed by straightening out the base portion so that it becomes essentially plane. The ends of the base portion is provided with gripping means which fit together with a couple of pulling tools for straightening out the base portion. The gripping means are arranged along the prolongation of the base portion and perpendicularly to the flanges. During the straightening out of the curved base portion, the work piece is placed around an axis, whereby one of the gripping means is attached to the axis and the other gripping means is attached to the pulling tool. The base portion is straightened by a pulling force applied to one end of the base portion through the pulling tools, whereby the axis exerts a counter force on the other end of the base portion.

To achieve the heat transfer, the heat transfer member is arranged with the side of the base opposite the flanges directed towards the object to be cooled or heated. Usually, the surface to be applied against the heat transfer member is plane. For the heat transfer to be as good as possible in such an application, it is important that the base portion is completely plane. A problem with this method of manufacturing is that the base portion cannot be straightened out completely After the straightening, the base portion is still slightly curved, which has to be treated afterwards to make it plane. This treatment could, for example, be the application of a bumping force against the base portion with any kind of striking apparatuses. This method is time consuming and is not suitable for manufacturing large series.

One way of at least partially solve this problem is shown in PCT/SE98/00671. By arranging effect members inside the base portion, a distance of momentum between the base portion and the pulling point is achieved. Thanks to this distance of momentum, it is possible to straighten the base portion completely when applying a pulling force to the effect members in a direction substantially parallel with the longitudinal axis of the base portion. A problem with this manufacturing method is that the base portion after the straightening still is not completely plane. During the straightening, there is a deformation of the material in the base portion which means that the material in the inner part of the curved base portion is straightened out and the material in the outer part is pulled together. During the pulling, the material in the inner part is more straightened out than the material in the outer part is pulled together, and as a consequence of that, there is an over-bending of the base portion so that the center of the base portion becomes slightly depressed. To obtain a completely plane heat transfer member, a subsequent treatment is necessary, for example by applying a bumping force against the base.

SUMMARY OF THE INVENTION

The object of the present invention is to obtain a method of producing a heat transfer member which method will not require any subsequent treatment since the heat transfer member will be sufficiently plane for use directly after the straightening of it.

Another object of the present invention is to obtain a device for producing a work piece for a heat transfer member and a work piece intended to be formed into a heat transfer member, which both makes it possible to use said method which does not require any subsequent treatment, What characterizes a method, a device and a work piece according to the invention will become clear from the appended claims.

The object of the inventive method is achieved by producing the work piece in a first step so that the distance between the outer and the inner surface of the base portion is increasing from its ends towards its central part. During the straightening, the deformation begins in the center of the curved base portion, where the distance of momentum is the largest. As soon as the deformation begins in the material, an axis of momentum is formed on each side of the center of the base portion. The bending moment is the largest at the axis of momentum. The over-bending resulting from said known method depends on the fact that the material in the inner radius of the base portion is straightened more than the material is pulled together in the outer radius of the base portion. This means that the bending resistance is lower in already straightened out material than it is in the material left to straighten out with an over-bending as a result. By forming the base portion of the work piece with the thickness decreasing from the center part towards the ends, already straightened out material will have the same, or higher, bending resistance compared to the material which will be straightened. Thus over-bending will be avoided and the base portion will be plane when the straightening is finished.

The object is further achieved with the initially mentioned device for producing a work piece for a heat transfer member, which is characterized in that the distance between the outer and the inner surface of the opening portion is increasing from its ends towards its central part.

To achieve essentially the same bending resistance in already straightened material as in the material to be straightened, the difference in the distance between the outer and the inner surface of the base portion of its ends and its central part should preferably be in the interval of 1–5%.

BRIEF DESCRIPTION OF THE DRAWINGS

With reference to the enclosed drawings, a more close description of preferred embodiment examples of the invention follows hereunder.

DETAILED DESCRIPTION OF PREFERRED EMBODIMENTS OF THE INVENTION

Figure 1:
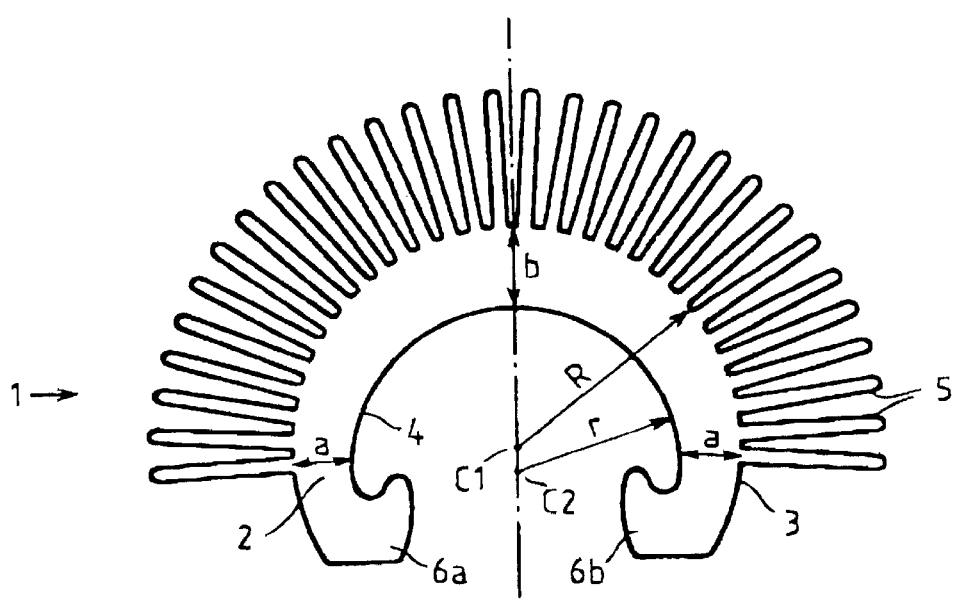
FIG. 1 is a side-view of a preferred embodiment of a work piece intended to be formed into a heat transfer member.

FIG. 1 shows a work piece 1 formed in a first step and intended to be further formed to a heat transfer member in a second step of a method according to the invention. The work piece 1 has a curved base portion 2 with an outer surface 3 and an inner surface 4. From the outer surface of the base portion, a number of flanges 5 are projecting. The outer surface 3 of the base portion comprises an arc with a radius R and a central point C1, and the inner surface 4 comprises an arc with a radius r and a central point C2. The central points C1 and C2 are slightly displaced relative to each other resulting in that the distance between the outer and the inner surface is gradually decreasing from the central part towards the ends. The distance between the outer and the inner surface in the central part of the base portion b is larger than the distance between the outer and the inner surface a in its ends. In a preferred embodiment in difference in thickness between the central part and the ends of the base portion is 1–5%, preferably 3,4%.

The work piece also comprises two gripping means 6a and 6b projecting from the inner surface 4 of the base portion, in a direction opposite to the direction of the flanges 5 The effect members 6a and 6b are in this embodiment designed in the form of hooks. The effect members are preferably made in one single piece with the base portion 2 in the first step. The effect members 6a and 6b are provided to be affected in the second step in order to deform the base portion 2 so that it becomes mainly plane and so that the flanges 5 are brought into a mutual relation, in which they are substantially mutually parallel. The effect members 6a and 6b are intended for being removed from the base portion after the deformation. The object intended to be subjected to heat transfer by the heat transfer member is intended to be arranged against the inner surface 4 of the base portion.

Figure 2:
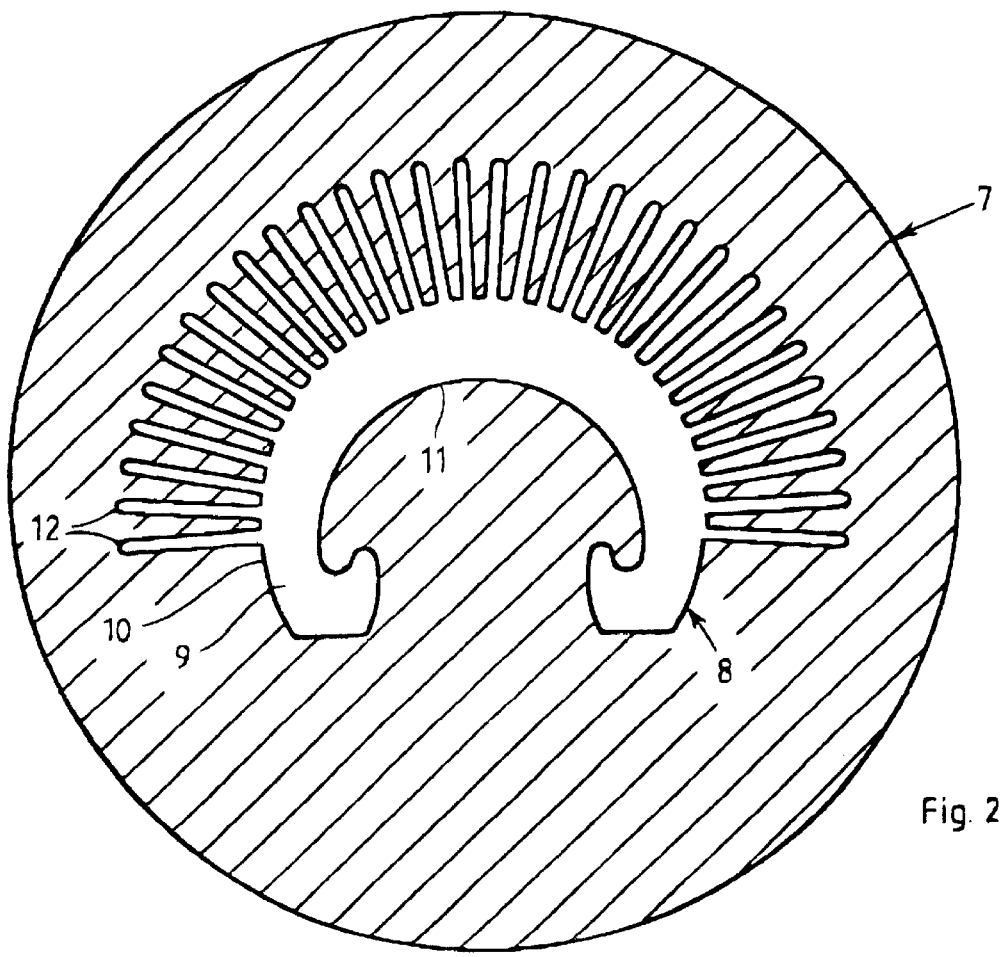
FIG. 2 is a cross-section through a preferred embodiment of a device for producing a work piece for a heat transfer member.

The manufacturing of the work piece in the first step of the inventive method is preferably carried out by supplying a forming tool with material in a liquid, or at least formable, state. For extrusion, this forming tool has an opening running through the same, the material being forced through the opening and receiving a cross-sectional form defined by the design of the opening. FIG. 2 shows a molding tool 7 according to an embodiment of the invention, having an opening 8 which comprises a curved opening portion 9 with an outer surface 10 and an inner surface 11, and a number of notches 12 projecting outwardly from the outer surface 10. The distance between the outer and the inner surface of the opening portion is increasing from its ends towards its central part.

A so-called profile is formed by the extrusion, said profile having a constant cross-section. The device shown in FIG. 1 illustrates a side-view of such an extruded profile. The profile extends perpendicularly to the plane of the paper, and by cutting the profile either before or after the second operation of the method, suitable lengths of the device may be achieved for the application in question.

It is also within the scope of the inventive claims to produce the work piece by supplying the material to a space inside the forming tool, the design of said space defining the design of the work piece.

The material used for achieving said work piece is preferably aluminum or some aluminum alloy. It is however also possible to use some other metal alloy, plastics, ceramics, or composites.

Figure 3A:
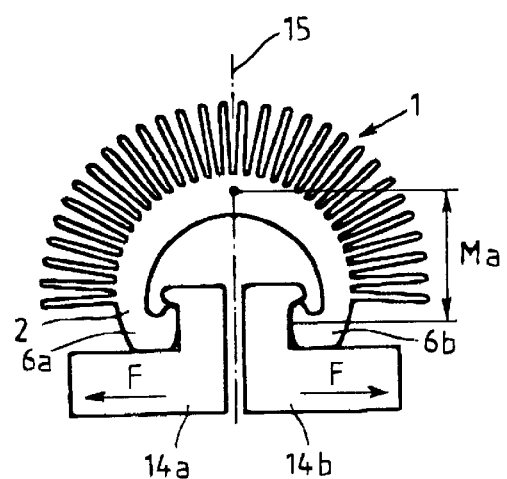
FIGS. 3a–3d show in a number of steps how the work piece is straightened out and is formed into a heat transfer member.

In a first step of a method for producing a heat transfer member according to invention, the work piece is produced by any kind of molding method. FIGS. 3a–3d show how a work piece in a second step is straightened out until it forms a heat transfer member with an essentially plane base portion. FIG. 3a illustrates how two pulling members 14a and 14b are applied against effect members 6a and 6b and are moved outwards in opposite directions with a force F acting on a distance of momentum Ma between the base portion and the contact surface between the pulling member and the effect members. When the pulling members are moved outwards, a bending force is applied on the base portion 2 through the effect members. The work piece has a center line 15 cutting through the center point of the base portion and being perpendicular to its inner and outer surfaces.

Figure 3B:
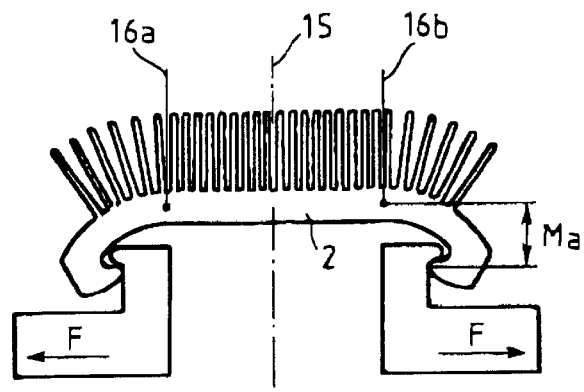

Since the distance of momentum Ma is the longest in the center of the base portion, the deformation of material will begin around a moment axis coincident with the center line 15. As soon as the deformation of the material begins, an axis of momentum 16a is formed on one side of the center line, and another axis of momentum 16b is formed on the other side of the center line 15 as illustrated in FIG. 3b. The bending moment is the highest at the axis of momentum. Since the thickness of the base portion is decreasing from its central parts towards its ends, the resistance against bending is equally or larger in already straightened material than it is in the material which has not been straightened, and thereby over-bending is prevented.

Figure 3C:
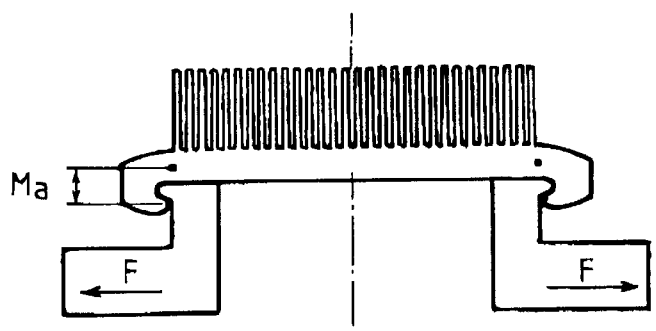
Figure 3D:
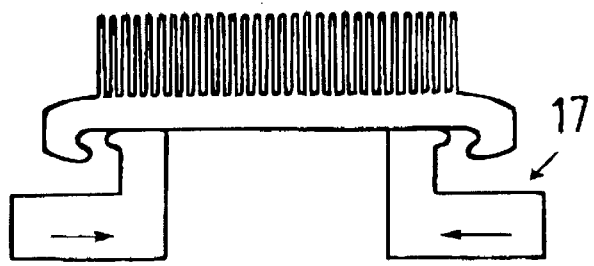

In FIG. 3c a heat transfer member with a completely straightened out base portion is illustrated. As seen in FIG. 3c, the location of the effect members relative to the base portion results in that there is still a distance of momentum Ma between the base portion and the contact surface between pulling tool and the effect members in the final stage of the straightening. This remaining distance of momentum makes it possible to straightening out the heat transfer member until it is plane without any remaining curve of the base portion. After the straightening is finished, the pulling tools are taken away. FIG. 3d illustrates the completed heat transfer member 17 having a substantially rectilinear base portion and flanges being substantially mutually parallel.

What is claimed is:

1. An extruded, heat-transfer-forming work piece comprising a curved arcuate base portion with an arcuate outer surface and an arcuate inner surface, and a number of flanges projecting outwardly from the arcuate outer surface of the base portion, characterized in that the arcuate outer surface is non-parallel to the arcuate inner surface and the distance between the arcuate outer and inner surfaces at the ends of the workpiece is less than the distance between the arcuate outer surface and the arcuate inner surface of the base portion at the middle of the workpiece, such that the distance or thickness between the surfaces gradually increases from each end of the workpiece to the middle of the workpiece.

2. The work piece according to claim 1, wherein the distance between the arcuate outer surface and the arcuate inner surface of the base portion at the ends of the workpiece and the distance at the middle of the workpiece is such that the middle of the workpiece is 1–5% thicker between the inner and outer surfaces than the thickness between the inner and outer surfaces at the ends of the workpiece.

3. The work piece according to claim 2, wherein the work piece is provided with hook shaped effect members at each end of the base portion, said effect members projecting from the arcuate inner surface of the base portion in a direction opposite to the direction in which the flanges extend.

4. The workpiece according to claim 1, wherein said arcuate inner surface is generally semi-cylindrical and said arcuate outer surface is non-parallel to said arcuate inner generally semi-cylindrical surface.

* * * * *